United States Patent
Ali et al.

(10) Patent No.: US 9,602,121 B2
(45) Date of Patent: Mar. 21, 2017

(54) BACKGROUND ESTIMATION OF COMPARATOR OFFSET OF AN ANALOG-TO-DIGITAL CONVERTER

(71) Applicant: ANALOG DEVICES, INC., Norwood, MA (US)

(72) Inventors: Ahmed Mohamed Abdelatty Ali, Oak Ridge, NC (US); Paritosh Bhoraskar, Greensboro, NC (US); Huseyin Dinc, Greensboro, NC (US); Andrew Stacy Morgan, Greensboro, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/793,524

(22) Filed: Jul. 7, 2015

(65) Prior Publication Data
US 2017/0012634 A1    Jan. 12, 2017

(51) Int. Cl.
  *H03M 1/10* (2006.01)
  *H03M 1/36* (2006.01)

(52) U.S. Cl.
  CPC ......... *H03M 1/1028* (2013.01); *H03M 1/361* (2013.01)

(58) Field of Classification Search
  CPC .......... H03M 1/12; H03M 1/46; H03M 1/001; H03M 1/66; H03M 3/50; H03M 1/00; H03M 1/1028; H03M 1/361
  USPC .......................... 341/120, 118, 119, 155, 161
  See application file for complete search history.

(56) References Cited

U.S. PATENT DOCUMENTS

| | | | | | |
|---|---|---|---|---|---|
| 4,947,168 | A | * | 8/1990 | Myers ................ | H03M 1/1042 341/120 |
| 5,755,234 | A | * | 5/1998 | Mobley ................ | A61F 11/08 128/864 |
| 6,323,791 | B1 | * | 11/2001 | Murden .............. | H03M 1/0607 341/118 |

(Continued)

OTHER PUBLICATIONS

Jipeng Li et al., "Background Calibration Techniques for Multistage Pipelined ADCs With Digital Redundancy", IEEE Transactions on Circuits and Systems—II: Analog and Digital Signal Processing, vol. 50, No. 9, Sep. 2003, pp. 531-538, 8 pages.

(Continued)

*Primary Examiner* — Jean B Jeanglaude
(74) *Attorney, Agent, or Firm* — Patent Capital Group

(57) ABSTRACT

A pipeline analog-to-digital converter (ADC) converts an analog input signal over several stages, where a stage generates a residue for the subsequent stage to digitize. The residue is generated by coarsely quantizing the analog input signal to generate a digital code, which is used to reconstruct the analog input signal, and the residue is the difference between the analog input signal and the reconstructed version of the analog input signal. The coarse quantization can have errors which are attributed to comparator offsets and bandwidth mismatch. To estimate the comparator offsets while being insensitive to bandwidth mismatch, peak and trough detectors are used to track maximum and minimum values of the residue or the output of the ADC over time, and an expected value estimating the comparator offset can be computed based on the maximum and minimum values. The expected value advantageously "averages" out the bandwidth mismatch contribution to the offset.

20 Claims, 9 Drawing Sheets

(56) References Cited

U.S. PATENT DOCUMENTS

| | | | | |
|---|---|---|---|---|
| 6,882,292 B1* | 4/2005 | Bardsley | ............ | H03M 1/0673 341/121 |
| 6,882,294 B2* | 4/2005 | Linder | ............... | H03M 1/0682 341/154 |
| 8,711,026 B1* | 4/2014 | Kappes | ................... | H03M 1/12 341/155 |
| 8,760,335 B1* | 6/2014 | Kappes | ................... | H03M 1/12 341/155 |
| 2009/0135037 A1 | 5/2009 | Agarwal et al. | | |

OTHER PUBLICATIONS

Pingli Huang et al., "SHA-Less Pipelined ADC with In Situ Background Clock-Skew Calibration", IEEE Journal of Solid-State Circuits, vol. 46, No. 8, Aug. 2011, pp. 1893-1903, 11 pages.

A.J. Ginés et al., "Background Digital Calibration of Comparator Offsets in Pipeline ADCs", manuscript, Very Large Scale Integration (VLSI) Systems, IEEE Transactions (vol. 23, Issue 7), 7 pages.

Lane Brooks et al., "Background Calibration of Pipelines ADCs via Decision Boundary Gap Estimation", IEEE Transactions on Circuits and Systems—I: Regular Papers, vol. 55, No. 10, Nov. 2008, pp. 2969-2979, 11 pages.

Kareem Ragab et al., "Digital Background Calibration for Pipelined ADCs Based on Comparator Decision Time Quantization", 1549-7747 © 2013, IEEE, 5 pages.

Nikos Petrellis et al., "Calibration Techniques for the Elimination of Non-Monotonic Errors and the Linearity Improvements of A/D Converters", Ultra Wideband Communications: Novel Trends—System, Architecture and Implementation, www.intechopen.com, pp. 247-265, 19 pages.

A. Zjajo et al., "Chapter 2, Analog to Digital Conversion", Low-Power High-Resolution Analog to Digital Converters, Analog Circuits and Signal Processing, DOI 10.1007/978-90-481-9725-5_2 © Springer Science+Business Media B.V., 2011, pp. 11-41, 31 pages.

Anthony Crasso, "Background Calibration of a 6-Bit 1Gsps Split-Flash ADC", A Thesis submitted to the Faculty of the Worcester Polytechnic Institute, Jan. 2013, 143 pages.

Walt Kester, "Which ADC Architecture is Right for Your Application?", Analog Dialogue 39-06, Jun. 2005, http://www.analog.com/analogdialogue, 8 pages.

* cited by examiner

BACKGROUND ESTIMATION OF COMPARATOR OFFSET OF AN ANALOG-TO-DIGITAL CONVERTER

TECHNICAL FIELD OF THE DISCLOSURE

The present invention relates to the field of integrated circuits, in particular to background estimation of comparator offset of an analog-to-digital converter in a manner that is insensitive to bandwidth mismatch and/or input distribution.

BACKGROUND

In many electronics applications, an analog input signal is converted to a digital output signal (e.g., for further digital signal processing) using an analog-to-digital converter (ADC). Generally speaking, ADCs are electronic devices that convert a continuous physical quantity carried by an analog signal to a digital number that represents the quantity's amplitude (or to a digital signal carrying that digital number). ADCs can be found in many places such as broadband communication systems, audio systems, receiver systems, etc. For instance, in precision measurement systems, electronics are provided with one or more sensors to make measurements, and these sensors may generate an analog signal. The analog signal would then be provided to an ADC as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

An ADC is typically composed of many electronic components making up an integrated circuit or a chip, and the ADC can be defined by the following application requirements: its speed, its bandwidth (the range of frequencies of analog signals it can properly convert to a digital signal), its resolution (the number of discrete levels the maximum analog signal can be divided into and represented in the digital signal), and its signal to noise ratio (how accurately the ADC can measure signal relative to the noise the ADC introduces), and so on. ADCs are used in a broad range of applications including communications, energy, healthcare, instrumentation and measurement, motor and power control, industrial automation and aerospace/defense. ADCs have many different designs, which can be chosen based on the application requirements. ADCs provide an essential functionality for electronics, and designing an ADC is a non-trivial task because each application may have different sets of requirements.

BRIEF SUMMARY OF THE DISCLOSURE

A pipeline analog-to-digital converter (ADC) converts an analog input signal over several stages, where a stage generates a residue for the subsequent stage to digitize. The residue is generated by coarsely quantizing the analog input signal to generate a digital code, which is used to reconstruct the analog input signal, and the residue is the difference between the analog input signal and the reconstructed version of the analog input signal. The coarse quantization can have errors which are attributed to comparator offsets and bandwidth mismatch. To estimate the comparator offsets while being insensitive to the input distribution and/or bandwidth mismatch, peak and trough detectors are used to track maximum and minimum values of the residue or the output of the ADC over time, and an expected value estimating the comparator offset can be computed based on the maximum and minimum values.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Understanding Analog-to-Digital Converters (ADCs)

ADCs come in many different flavors, each having their own advantages and disadvantages. Flavors include, delta-sigma ADCs, subranging ADCs, pipeline ADCs, etc. Depending on the application, a particular flavor may be chosen to meet a set of requirements. For instance, pipeline ADCs are typically categorized as a high speed ADC (e.g., with sample rates above 1 million samples per second (MSPS) or even above 10 MSPS). Accordingly, pipelined ADCs are used often with broadband, communications, video, software radio applications, instrumentation (digital oscilloscopes, digital spectrum analyzers), etc.

Figure 1:
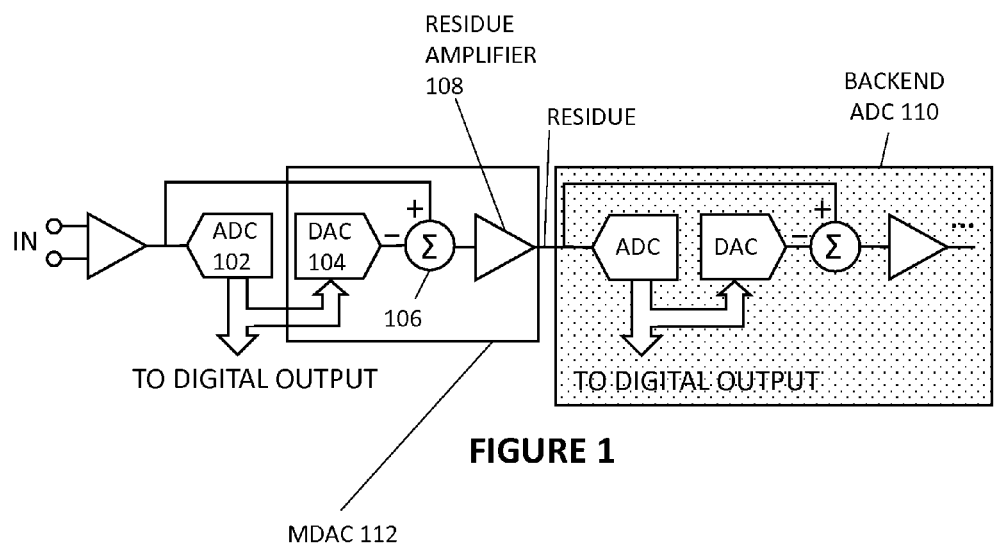
FIG. 1 shows an exemplary pipeline ADC, according to some embodiments of the disclosure.

FIG. 1 shows an exemplary pipeline ADC, according to some embodiments of the disclosure. Pipelined ADCs converts an analog input signal in stages. A sub-ADC 102 coarsely converts the analog input signal provided at IN, and generates a digital output code. Examples of the sub-ADC includes a flash ADC, 2-bit ADC, 3-bit ADC, 4-bit ADC, and any suitable low resolution ADC. The sub-ADC 102 may include a plurality of comparators that compare the input IN against a plurality of different reference voltages, and accordingly, generate a digital output (e.g., an output code) representative of the input IN. The digital output code, which is a coarse conversion of the analog input signal is converted back to analog to generate a reconstructed version of the analog input signal by a sub-DAC 104. The reconstructed version of the analog input signal is subtracted from the (held) analog input signal by the summing (or difference) node 106. The difference between the analog input signal and the reconstructed version of the analog input signal is then amplified by residue amplifier 108 to generate a residue signal VR. The residue signal VR is then provided to further stage(s) in the backend 110 for digitization. The digital output codes from the plurality of stages are combined to provide the final or overall digital output of the pipeline ADC.

To offer high sampling rate (i.e., high speed conversion), each of the two stages operates on the data for one-half of the conversion cycle, and then passes its residue output to the next stage in the "pipeline" prior to the next phase of the sampling clock. The term "pipeline" in pipeline ADC refers to the ability of one stage to process data from the previous stage during any given clock cycle. At the end of each phase of a particular clock cycle, the output of a given stage is passed on to the next stage using the track/hold functions, and new data is shifted into the stage. The digital outputs of all but the last stage in the "pipeline" can be stored in the appropriate number of shift registers so that the digital data arriving at the correction logic corresponds to the same sample. Usually, a multiplying DAC (MDAC) 112 (which can include can include sample and hold circuitry (not shown), sub-DAC 104, summation/difference node 106, and the residue amplifier 108) is used to provide the appropriate amount of interstage gain as well as the subtraction function.

It is understood by one skilled in the art that there are many different implementations or designs for a pipelined ADC. For instance, some pipelined ADCs uses flash converters as building blocks, wherein flash converters make use of parallel comparators each operating with a slightly different reference voltage (threshold) determined by a resistor ladder network. In some other instances, some ADCs utilize other architectures for the individual ADCs.

Errors of the Sub-ADC in a Pipeline ADC and Challenges in Measuring the Errors

Ideally, the residue VR should have a regular sawtooth pattern in relation to the analog input signal, e.g., with values ranging from −FS/4 to FS/4 (FS stands for "Full Scale", e.g., the range can go from Vref/2 to −Vref/2). However, the sub-ADC in the pipeline stage (e.g., sub-ADC 102 of FIG. 1) is not ideal, and the residue VR can exhibit imperfect steps in the sawtooth pattern. For instance, if a comparator of the sub-ADC has an offset (i.e., threshold being used by the comparator is no longer at the ideal/intended value), the residue VR can overshoot or undershoot at the ADC thresholds. The overshoot or undershoot of the residue VR can become a problem because proper conversion generally requires that residue signal VR being provided to the next stage is limited to a range of acceptable voltages. Providing a residue VR that is outside of the range of acceptable voltages to the next stage ("over-ranging") would lead to (catastrophic) conversion errors.

Figure 2:
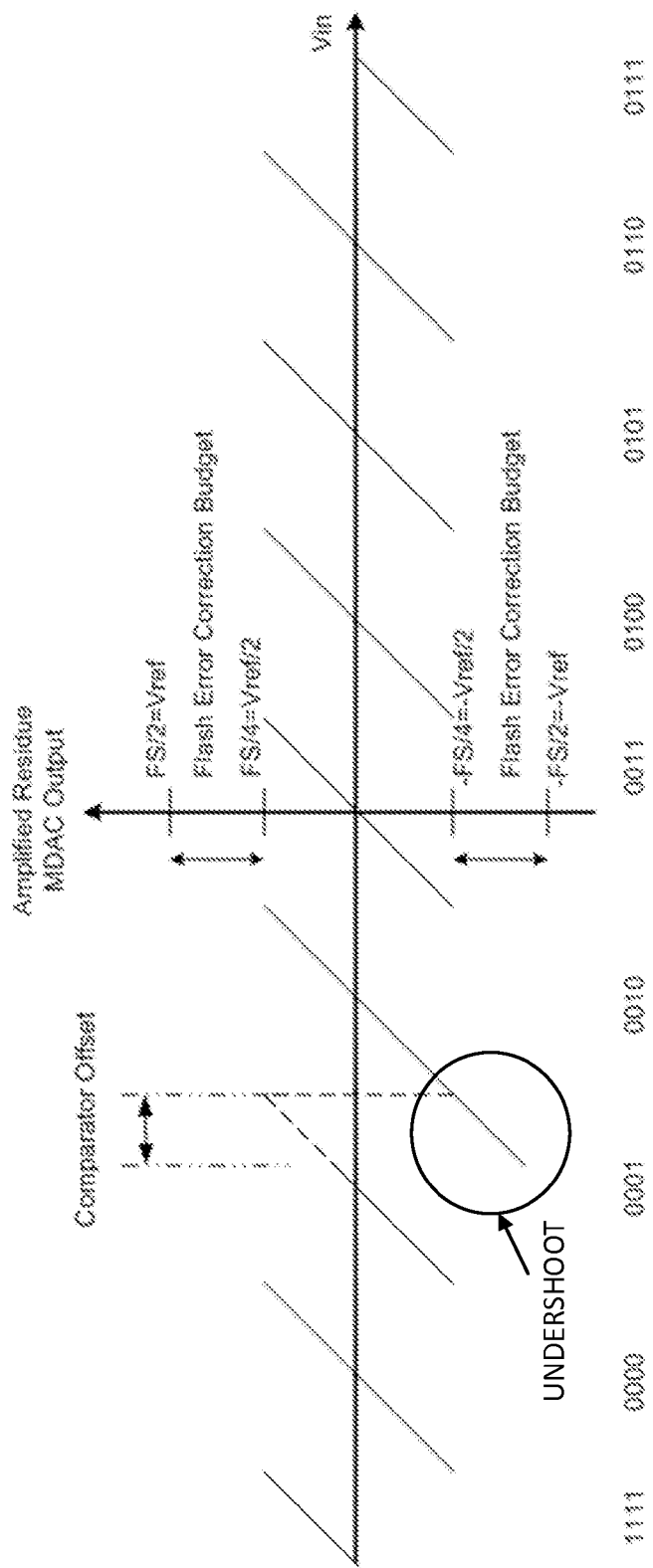
FIG. 2 illustrates the effect of comparator offset on the amplified residue.

FIG. 2 illustrates the effect of comparator offset on the amplified residue. Due to a comparator offset of the comparator responsible for codes 0001 and 0010, the amplified residue MDAC output VR reaches into the range between −FS/4 and −FS/2. Comparator offsets are generally well tolerated in pipelined ADCs because of the stage redundancies that lead to a "correction range" or "error correction budget" in the output of each stage. Phrased differently, the pipeline ADC continues to operate properly if the residue does not exceed the range of acceptable voltages for the next stage. In this example, the error correction budget allows for a range of voltages up to −FS/2 to FS/2 (e.g., Vref to −Vref). As long as the residue VR is inside the correction range, it can be corrected by the following stages without over-ranging them.

Generally speaking, trimming at test (e.g., involving fuses) can reduce the comparator offset. However, such technique is limited to correcting a fixed comparator offset measured at test, and is not suitable for correcting changing offsets, e.g., comparator offsets that increase over time during use. For instance, as pipeline ADCs are being implemented using finer geometry processes, aging effects due to negative bias temperature instability (NBTI) and positive bias temperature instability (PBTI) can lead to an offset increasing with time that may consume a significant portion of the (small) correction range. Such increasing offset is an issue, e.g., in fine geometry 65 nm and 28 nm processes, and over-ranging can still occur. Therefore, even though the comparator offsets can be trimmed at the tester, it is desirable to have a mechanism to correct for their offsets in the background to track environmental and aging changes. The concern for over-ranging due to aging is even more significant in smaller technology nodes where the range of suitable voltages for the residue VR is far smaller (since Vref or FS tend to be smaller).

Furthermore, some techniques rely on taking one comparator offline to calibrate it or store the offset in the sampling phase and use it to for cancellation in the comparison phase. Among other things, these techniques always lead to a slow-down in the comparator propagation delay and/or sampling delay due to the need to add additional switches in the propagation or sampling paths. For pipeline ADCs where the speed is pushed to the maximum allowed by the process, this speed degradation can be unacceptable.

Figure 3:
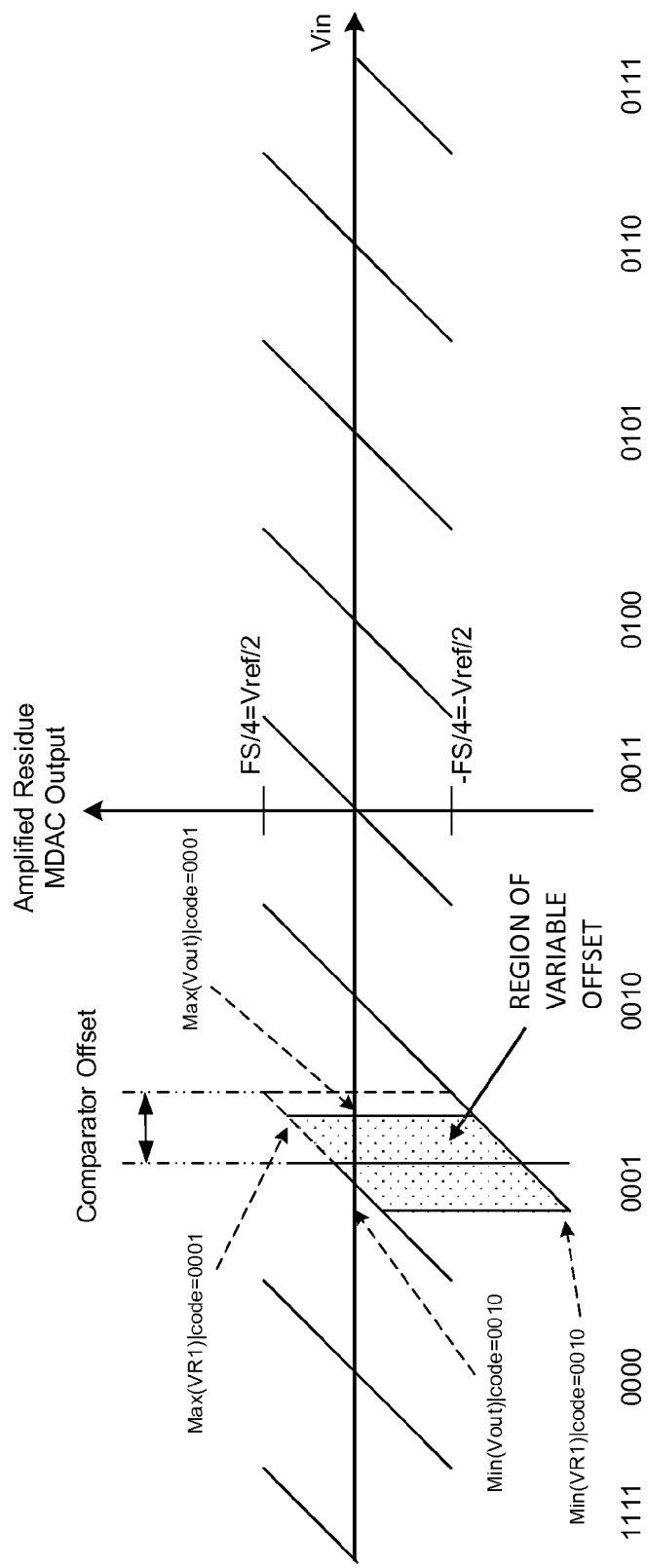
FIG. 3 illustrates the effect of comparator offset and bandwidth mismatch on the amplified residue, according to some embodiments of the disclosure.

Besides static and changing comparator offsets, over-ranging can occur due to bandwidth (BW) mismatch. The demand for radio frequency (RF) sampling increases the input frequency, which can lead to an increased usage of the correction range because of the BW mismatch between the flash and MDAC paths in SHA-less architectures (architecture without sample-and-hold amplifiers). FIG. 3 illustrates the effect of comparator offset and bandwidth mismatch on the amplified residue, according to some embodiments of the disclosure. It can be seen that the amplified residue MDAC output VR has a region of variable offset. The region of variable offset is due to the effect of BW mismatch, which can vary depending on the polarity of the slope of the input signal. For instance, if there is a bandwidth (timing) mismatch in the timing of sampling of a sine wave, and the sampling instance is late on the rising part of the sine wave, then the sampled voltage is larger than it should be. If the sampling instance is late on the falling part of the sine wave, then the sampled voltage is smaller than it should be. In one sampling instance, the offset appears as a positive offset; in the other sampling instance, the offset appears to be a negative offset. Thus, the effect of the bandwidth mismatch appears to be sometimes positive and sometimes negative.

When bandwidth mismatch is present in combination with comparator offset, a range of variable offset around the actual comparator offset would appear in the residue VR. The range may or may not be symmetric about the actual comparator offset, since the input signal may not have a even/symmetric distribution of the polarity of the signal. Extracting the comparator offset in the presence of variable offset due to bandwidth mismatch is not trivial.

Besides issues of increasing comparator offsets, bandwidth mismatch, and limitations of finer geometry processes, other factors such as the injection of a calibration signal, the increase in the input span, and reduction in the supply voltage, can further contribute to making the correction range a precious commodity. Thus, it would be advantageous to extract and correct the offsets in the comparators, so that in totality, all these error sources can fit within the limited correction budget.

Background Method for Estimating Comparator Offset Insensitive to Bandwidth Mismatch and the Input Distribution Since over-ranging can have components caused by both comparator offset and BW mismatch, it can be challenging to observe the stage residue or the overall ADC output to extract the offset without being affected by the BW mismatch component. To address one or more issues mentioned above, a background method described herein estimates or extracts the comparator offset based on the residue VR or the overall ADC output (even in the presence of BW mismatch effect on the residue and the overall ADC output). Specifically, the background method is capable of averaging out the offsets due to BW mismatch and extracting only the offsets due to other causes such as comparator offset. The background method observes pairs of information from neighboring subranges over many samples to estimate the actual comparator offset, and the technique is designed in such a way that would average out the effect of the BW mismatch (i.e., the region of variable offset), and be insensitive to the input distribution. Furthermore, the background method is able to estimate and correct for changing comparator offsets.

Figure 4:
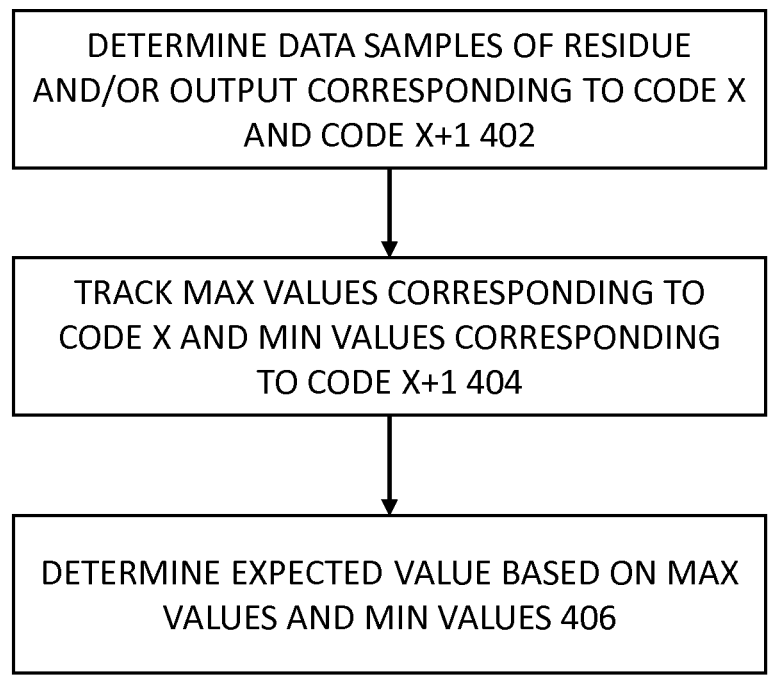
FIG. 4 shows a flow diagram illustrating a background method for estimating comparator offset of a sub-analog-to-digital converter (sub-ADC) of an analog to digital converter (ADC) while being insensitive to input distribution and/or bandwidth mismatch of the sub-ADC, according to some embodiments of the disclosure.

FIG. 4 shows a flow diagram illustrating a background method for estimating comparator offset of a sub-analog-to-digital converter (sub-ADC) of an analog to digital converter (ADC) while being insensitive to input distribution and/or the bandwidth mismatch of the sub-ADC, according to some embodiments of the disclosure. The background method runs as the ADC converts an analog input signal into a digital output representing the analog input signal. An illustration of how the background method works is explained in relation to two exemplary neighboring codes 0001 and 0010 of FIG. 3. The method illustrated in FIG. 4 can be used to measure the offset of the comparator responsible for the two neighboring codes. The same method can be applied to other pairs of neighboring codes to estimate the offset of other one or more of the comparators of the sub-ADC.

In task 402, a first logic or circuitry determines data samples of (1) a residue signal (VR) generated based on a difference between an input signal to the sub-ADC and a reconstructed version of the input signal or (2) an output signal of the ADC, wherein data samples corresponds to either a first code or a neighboring code, and the first code and the neighboring code are associated with a comparison made by a comparator of the sub-ADC. In some embodiments, the sub-ADC can be a flash ADC or quantizer of a first stage of a pipeline analog-to-digital converter. Generally, the comparator offset of the first stage has the greatest effect on the overall performance of the pipeline ADC. Data samples of the residual signal can be readily available as a digital signal DR generated by a sub-ADC of the subsequent stage (processing the residual signal VR). Data samples of the output of the overall ADC is also readily available as a digital signal Dout, which is the digital output of the overall ADC combining the digital output codes of each stage. Herein, passages use VR and DR interchangeably, and use Vout and Dout interchangeably.

Referring back to FIG. 3, the first logic/circuitry determines data samples of the residue signal (VR) corresponding to code 0001 (VR1|code=0001) and 0010 (VR1|code=0010) on the y-axis or data samples of the output signal of the ADC corresponding to code 0001 (Vout|code=0001) and 0010 (Vout|code=0001) on the x-axis. For a pipeline ADC, the residue VR being observed can be the residue of any one of the stages, e.g., the first stage or front end stage of the pipeline ADC. The overall ADC output being observed would be the digital output generated based on the digital output code generated by all the states of the pipeline ADC. The data samples serve as measurements that that can information from which the comparator offset can be estimated.

Extracting the comparator offset from the data samples is not trivial. Simple averaging of the data samples themselves does not always work well because the region of variable offset is not necessarily symmetric. Such averaging scheme would be sensitive to the input distribution (i.e., while averaging can still "average" out some BW mismatch, the averaging scheme may not be able to average out the BW mismatch completely if the input distribution skews the region of variable offset). If the input is not uniformly/evenly/symmetrically distributed, the region of variable offset observed from the data samples would be skewed by the input distribution. The correction scheme would end up correcting for something that looks like an offset, but actually has a BW mismatch contribution to it. One technical goal is to provide a method which can respond to the comparator offset, and not be severely affected by the input distribution. To be insensitive to the input distribution and still be able to average out the BW mismatch component, the technique tracks the actual comparator offset based on data samples taken over time by maintaining state information about two neighboring subranges (e.g., peaks and troughs corresponding to two neighboring codes). Then, the state information (but not the data samples themselves) is averaged.

In task 404, a second logic or circuitry and non-transitory storage medium tracks, over time, (1) maximum values of the data samples corresponding to the first code and/or (2) minimum values of data samples corresponding to the neighboring code. The maximum and minimum values serves as the state information of the neighboring subranges, or phrased differently, the tracking of the maximum and minimum values maintains the greatest and smallest value observed so far for many instances in time. The state information of the neighboring subranges provide an improved indicator for the actual comparator offset because this state information is insensitive to the input distribution. Herein, maximum values are also referred to as peaks, and minimum values are also referred to as troughs. The tracking of the maximum values is performed by a suitable peak detector. The tracking of the minimum values is performed by a suitable trough detector.

Referring back to FIG. 3, the tracking can maintain the maximum values of the residue of code k (e.g., k=0001) by observing many data samples of the residue on the y-axis over a period of time. A maximum value of the data samples observed so far can be computed in view of each new observation (i.e., current data sample) and latest maximum value, and the maximum values computed over many data samples can be stored/maintained. The tracking can also maintain the minimum values of residue of the neighboring code k+1 (e.g., k+1=0010) by observing many data samples of the residue on the y-axis over the same period of time. A minimum value of the data samples observed so far can be computed in view of each new observation (i.e., current data sample) and the latest minimum value, and the minimum values computed over many data samples can be stored/maintained.

Alternatively or additionally, the tracking can maintain the maximum value of the output of the ADC of code k (e.g. k=0001) by observing many data samples of the output of the ADC on the x-axis over a period of time. A maximum value of the data samples observed so far can be computed in view of each new observation (i.e., current data sample) and latest maximum value, and the maximum values computed over many data samples can be stored/maintained. The tracking can also maintain the minimum values of output value of the ADC of the neighboring code k+1 (e.g., k+1=0010) by observing many data samples of the output of the ADC on the y-axis over the same period of time. A minimum value of the data samples observed so far can be computed in view of each new observation (i.e., current data sample) and the latest minimum value, and the minimum values computed over many data samples can be stored/maintained.

Both the residue and the output of the ADC can provide an accurate estimate of the actual comparator offset, thus either one or both can be used for the estimation of the actual comparator offset. The state information, i.e., the maximum and minimum values can be stored as a series of values for further processing (or compressed in a suitable form). The tracking of maximum and minimum values can be seen as peak and trough detection. By using peak and trough detectors, the state information of two neighboring subranges is no longer sensitive to the input distribution. The state information is not affected by whether the region of variable offset is symmetric or not. Specifically, the maximum and minimum values of respective neighboring codes provide state information about neighboring subranges without being severely affected by input distribution.

In task 406, third logic or circuitry determines an expected value estimating an offset of the comparator based on the maximum values and/or minimum values. Determining an expected value based on the maximum values and/or minimum values, i.e., the averaging of the state information (e.g., series of maximum and minimum values), can average out the BW mismatch component and yield the actual comparator offset. Used herein, the expected value provides an averaging function for the maximum and values and minimum values tracked over a period of time. The expected value can be computed by averaging values of a function involving the maximum values and/or minimum values.

The estimation of the comparator offset using the method described with respect to FIGS. 3 and 4 can be performed in the background (during normal operation of the ADC). Effectively, the technique can correct comparator offsets due to statistical mismatches, settling errors, aging, etc. Since the method operates in the background, the techniques are capable of tracking changes in temperature, supply and device aging effects due to NBTI and PBTI.

The background method can run for a limited period of time, or continuously during the operation of the ADC. If the background method is running for a limited period of time, the method can be triggered periodically, or in response to a signal which triggers the background method to run.

The background method is very desirable because the effect of BW mismatch tends to be dependent on the input frequency and/or input distribution and hence can lead to misleading results if the measurement method is not designed properly. In addition, the direction of the offsets due to BW mismatches tends to depend on the direction of the input slope, trying to correct for such offset without the slope information would also lead to wrong results. For these reasons, and the fact that BW mismatch does not dominate the offset budget in many cases, it is beneficial to provide a comparator offset estimation technique that is insensitive to BW mismatch and/or the input distribution and is able to extract the offset without the influence of the BW mismatch effects.

Computing the Expected Value Based on the Maximum and/or Minimum Values

The expected value can be used as a measure of the actual comparator offset, and the expected value can be used for calibrating or correcting for the offset based on the expected value using mechanisms known to one skilled in the art (e.g., trimming, digital correction). In some embodiments, the expected value finds an average based on maximum values (e.g., maximum, leaky maximum) of a residue or output corresponding a certain code and minimum values (e.g., minimum, leaky minimum) of the residue or output corresponding to a neighboring code. In some embodiments, the expected value finds an average of values, each value computed based on a maximum value (e.g., maximum, leaky maximum) of a residue or output corresponding a certain code and a minimum value (e.g., minimum, leaky minimum) of the residue or output corresponding to a neighboring code.

The expectation or average based on the maximum and minimum values extracts the comparator offset while being insensitive to the BW mismatch (i.e., the expected value or the average value averages out the BW mismatch). Also, the maximum and minimum values being tracked is insensitive to the input distribution. The more data is gathered on the maximum and minimum values, the closer the algorithm can extract the comparator offset. Accordingly, the expected value is computed based on data collected over a period of time. This is because the variable offset due to BW mismatch can move the overshoot or undershoot back and forth. By accumulating maximum and minimum values (or values derived therefrom) over a certain amount of time, the "true" value representative of the comparator offset can be determined by finding an expected value based on the accumulated values.

In some embodiments, any one or more of the following illustrative functions can be used on the maximum and minimum values of the digital residue VR to compute an estimate "e" that represents the comparator offset.

$$e = E\{([\max I(VR)|code=x] + [\min I(VR)|code=(x+1))/2]\} \tag{1a}$$

$$e = E\{[\max I(VR)|code=x] + [\min I(VR)|code=(x+1)]\} \tag{1b}$$

$$e = E\{([\max I(VR)|code=x] + [\min I(VR)|code=(x+1))/2]\} - ideal\_threshold \tag{1c}$$

$$e = E\{[\max I(VR)|code=x] + [\min I(VR)|code=(x+1)]\} - ideal\_threshold \tag{1d}$$

The function maxI( ) and minI( ) represents a peak detector for tracking maximum values and a trough detector for tracking minimum values, respectively. Details of the peak and trough detectors are described in a later section.

The expected value "e" is computed based on many maximum values and many minimum values tracked over a period of time.

The data samples used for the background method are based on the residual signal VR corresponding to code x and code x+1. At a given instance, computing [maxI(VR)|code=x]+[minI(VR)|code=(x+1)/2] yields a midpoint between a maximum value of the residue of a first code x (maxI(VR)|code=x) and a minimum value of the residue of a neighboring code x+1 (minI(VR)|code=x+1). Logic is provided to determine the expected value based on the maximum values and/or minimum values by (1) accumulating, over time, values representing a midpoint between a current maximum value and a current minimum value, and (2) determining the expected value based on the accumulated values. The divide by 2 can be omitted due to the fact it is a constant multiplication factor. The ideal_threshold can also be omitted if there is no DC offset in the residue VR to take into account.

The resulting estimate "e", i.e., the expected value, is an average based on the peak values (many maximum values represented by maxI(VR)|code=x) and trough values (many minimum values represented by minI(VR)|code=x). The expected value based on the peak and trough values is insensitive to the input distribution and averages out the variable offset caused by BW mismatch.

In some embodiments, any one or more of the following illustrative functions can be used on the maximum and minimum values of the digital output of the ADC Vout to compute an estimate "e" that represents the comparator offset.

$$e = E\{[\max I(Vout)|code=x],[\min I(Vout)|code=(x+1)]\} \quad (2a)$$

$$e = E\{[\max I(Vout)|code=x],[\min I(Vout)|code=(x+1)]\} - \text{ideal\_threshold} \quad (2b)$$

As previously mentioned, the function maxI( ) and minI( ) represents a peak detector for tracking maximum values and a trough detector for tracking minimum values, respectively. Details of the peak and trough detectors are described in a later section. The expected value "e" is computed based on many maximum values and many minimum values tracked over a period of time.

The data samples used for the background method are based on the digital output signal Vout of the overall ADC corresponding to code x and code x+1. At a given instance, computing [maxI(Vout)|code=x] and/or [minI(Vout)|code=(x+1)] yields a pair of values for the two neighboring subranges corresponding to code x and code (x+1). Logic is provided to determine the expected value based on the maximum values and/or minimum values by (1) accumulating, over time, maximum values and/or minimum values; and (2) determining the expected value based on the accumulated values. The ideal_threshold can also be omitted if the logic or circuitry for calibrating/correcting for the comparator offset takes the ideal threshold into account when the expected value or the estimate "e" is received as input.

The resulting estimate "e", i.e., the expected value, is an average of the peak values (many maximum values represented by maxI(Vout)|code=x) and trough values (many minimum values represented by minI(Vout)|code=x). The expected value of the peak and trough values is insensitive to the input distribution and averages out the variable offset caused by BW mismatch. The expected value can be computed based on (1) just the maximum values maxI(Vout)|code=x, (2) just the minimum values minI(Vout)|code=x+1, (3) both the maximum values maxI(Vout)|code=x and the minimum values minI(Vout)|code=x+1. Any one of the three scenarios would provide values usable for the expected value computation. By accumulating the values, expected value can extract the actual comparator threshold while being insensitive to the input distribution.

Generally speaking, the functions can be applied to data samples of two neighboring codes x and x+1 to determine an estimate "e" which is representative of the comparator offset. The estimate "e" can then be used for calibrating or digitally correct the ADC. Estimates can be determined for different comparator thresholds by applying the same or similar function to other pairs of neighboring codes. Many instances of the maximum and minimum values (i.e., state information about the two neighboring ranges) are maintained. In some cases, values computed based on the maximum and minimum values, or the maximum and/or minimum values themselves are accumulated so that an expected value can be computed.

Leaky Peak and Trough Detectors

Instead of observing the absolute maximum values and minimum values, the peak and trough detectors can be leaky. The reason to use leaky peak and trough detectors is allow recovery from possible erroneous or wrong samples that can cause the detectors to overestimate the maximum or minimum value. When the peak and trough detectors are leaky, the detectors can still detect the peaks and troughs, but it can also delay slowly so that the peaks and troughs can recover with time if a wrong sample causes an erroneous peak or trough to be detected. Recovering from a false maximum (or minimum) is important for the estimation to be accurate. The implementation of the leaky peak and trough detectors can be done efficiently and digitally using a combination of a leaky integrator and a peak/trough detection function. In addition, these detectors can have different time constants for the peak/trough detection (reasonably fast) and the leak/decay (slow). Both time constants are programmable.

For the leaky peak detector maxI(D[n]), the following exemplary function can be used.

$$Dp[n+1] = Dp[n] + \alpha(D[n] - Dp[n]) \quad (3)$$

Where Dp[n+1] is the new peak value, Dp[n] is the current peak value, D[n] is the current data sample (e.g., the residual signal or the overall output of the ADC). The constant α determines the time constant, and it can be set such that:

$$\alpha = \begin{cases} \text{large value} & \text{if } D[n] - Dp[n] \text{ is positive} \\ \text{small value} & \text{if } D[n] - Dp[n] \text{ is negative} \end{cases}$$

Generally speaking, α is a value between 0 and 1, and α can govern how fast data samples larger than the current peak affects the new peak values being computed, and how fast the data samples smaller than the current peak affects the new peak values being computed. When α is large and the current data sample is larger than the current peak value, the "attack time" is fast. When α is small and the current data sample is larger than the current peak value, the "attack time" is slow. When α is small and the current data sample is smaller than the current peak value, the "decay time" is slow. When α is large and the current data sample is smaller than the current peak value, the "decay time" is fast. Generally speaking, the "decay time" provides the recovery function so that the peak values "leak" over time when data samples are smaller than the current peak value.

Using the function, logic or circuitry can track the maximum values of the data samples by generating a new maximum value (Dp[n+1]) based on a current maximum value (Dp[n]) and a first difference between a current data sample of the data samples and the current maximum value (D[n]−Dp[n]). The first difference is scaled by a first coefficient α (which is programmable) and is combined with the current maximum value. The value of the first coefficient α depends on whether the first difference is positive or negative.

For the leaky trough detector minI(D[n]), the following exemplary function can be used.

$$Dt[n+1]=Dt[n]+\alpha(D[n]-Dt[n]) \quad (4)$$

Where Dt[n+1] is the new trough value, Dt[n] is the current trough value, D[n] is the current data sample (e.g., the residual signal or the overall output of the ADC). The constant α determines the time constant, and it can be set such that:

$$\alpha = \begin{cases} \text{large value} & \text{if } D[n]-Dp[n] \text{ is negative} \\ \text{small value} & \text{if } D[n]-Dp[n] \text{ is positive} \end{cases}$$

Generally speaking, α is a value between 0 and 1, and α can govern how fast data samples smaller than the current trough affects the new trough values being computed, and how fast the data samples greater than the current trough affects the new trough values being computed. When α is large and the current data sample is smaller than the current trough value, the "attack time" is fast. When α is small and the current data sample is smaller than the current trough value, the "attack time" is slow. When α is small and the current data sample is greater than the current trough value, the "decay time" is slow. When α is large and the current data sample is greater than the current trough value, the "decay time" is fast. Generally speaking, the "decay time" provides the recovery function so that the trough values "leak" over time when data samples are greater than the current trough value.

Using the function, logic or circuitry can track the minimum values of the data samples comprises generating a new minimum value (Dt[n+1]) based on a current minimum value (Dt[n]) and a second difference between a current data sample of the data samples and the current minimum value (D[n]-Dt[n]). The second difference is scaled by a second coefficient α (which is programmable) and is combined with the current minimum value. The value of the second coefficient α depends on whether the second difference is positive or negative.

Figure 5:
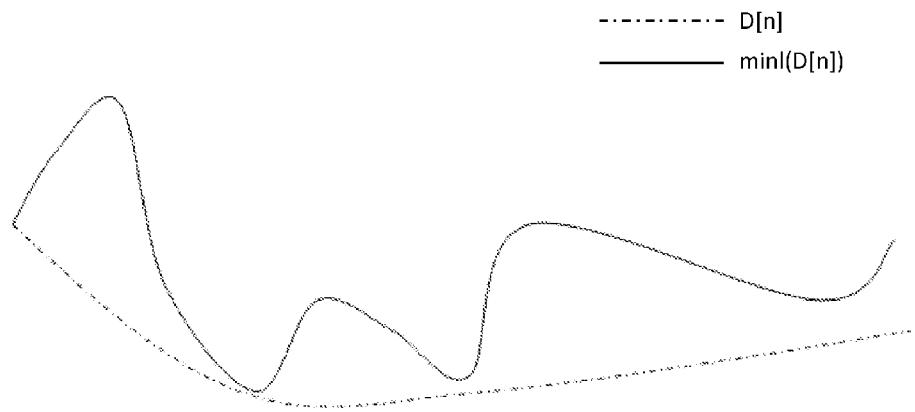
FIG. 5 shows a leaky trough detector with slow attack and slow leak, according to some embodiments of the disclosure.
Figure 6:
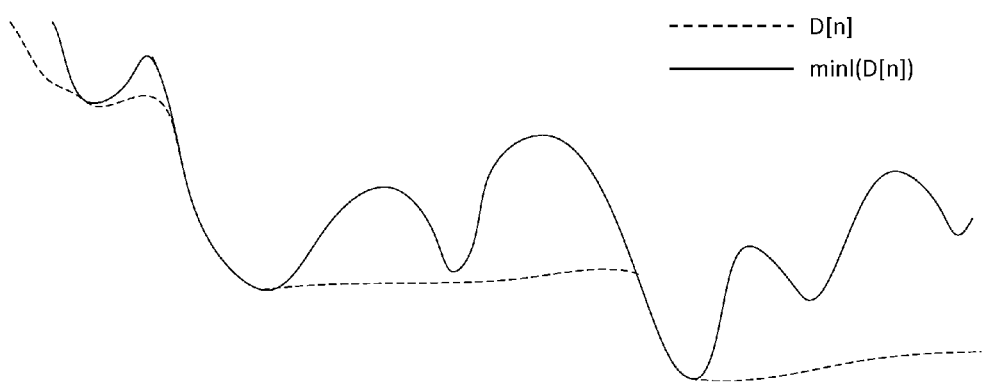
FIG. 6 shows a leaky trough detector with fast attack and slow leak, according to some embodiments of the disclosure.

FIG. 5 shows a leaky trough detector with slow attack and slow leak, according to some embodiments of the disclosure, and FIG. 6 shows a leaky trough detector with fast attack and slow leak, according to some embodiments of the disclosure. Comparing the two FIGURES, it can be seen that when the "attack time" is fast (in FIG. 6), the trough values minI(D[n]) catches up more quickly to the data samples which are greater than the current trough value than when the "attack time" is slow (in FIG. 5). In both FIGURES, the "decay time" allows the trough values to decay (in this case, increase) slowly in case the trough detector processed erroneous data samples. In general, it is preferred that attack time is fast while decay time is slow.

Exemplary Implementation and Data Processing Flow

Figure 7:
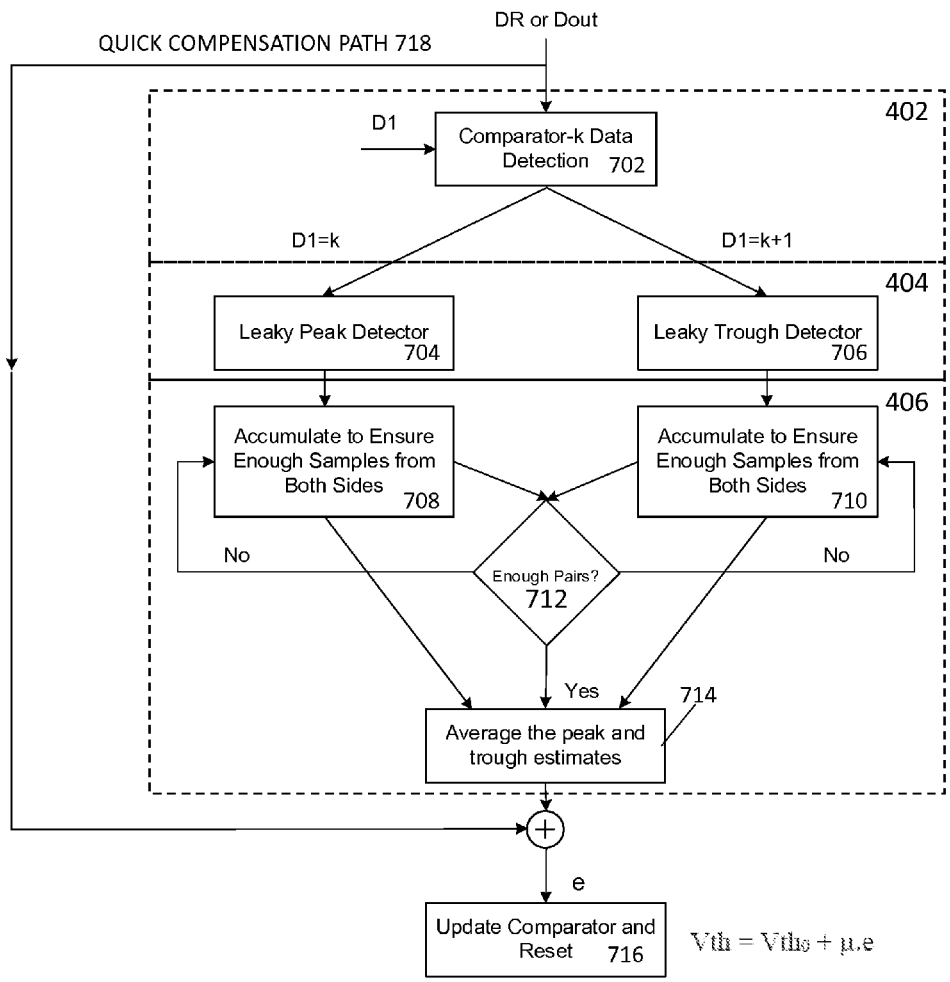
FIG. 7 illustrates an exemplary data processing flow for the background method shown in FIG. 4, according to some embodiments of the disclosure.

FIG. 7 illustrates an exemplary data processing flow for the background method shown in FIG. 4, according to some embodiments of the disclosure. The data processing flow shows how the comparator offset can be estimated for one of the comparators in a sub-ADC. Two neighboring codes k and k+1 are associated with this comparator. In task 702, the digital output code D1 from the sub-ADC (e.g., of a first stage of a pipeline ADC) can be used to gate the data samples of the residue DR or the overall ADC output Dout to limit the peak/trough detection to the data samples that pertain to this specific comparator (i.e., associated with neighboring codes D1=k and D1=k+1).

In task 704, all data samples of the residue DR (or output Dout) that correspond to code k, goes through a leaky peak detector to detect the maximum residue DR (or output Dout) value that corresponds to code k. This corresponds to the function "maxI" in equation (3) above. In task 706, all data samples of the residue DR (or output Dout) that correspond to code k+1 pass through the leaky trough detector to detect the minimum residue DR (or output Dout) value for code k+1, which corresponds to the function "minI" in equation (4) above. A maximum value can be computed for each data sample corresponding to code k; a minimum value can be computed for each data sample corresponding to code k+1.

In task 708 and 710, these maximum and minimum values are accumulated. At decision point 712, it is determined whether enough values are accumulated (e.g., based on whether the number of values accumulated crosses a threshold value). This is done to ensure appropriate pairing between the two neighboring ranges (e.g., the two sides, or the two neighboring codes) to allow for reasonably accurate elimination of the BW mismatch contribution.

In task 714, the expected value "e" is computed based on the accumulated maximum and minimum values accordingly. The computation is based on the exemplary functions described in a previous section.

Updating Comparator Offset

In task 716, once enough samples (pairs) have been accumulated and an expected value "e" is computed, the comparator operating with a voltage threshold Vth can be updated. The updating can be performed by the function $Vth=Vth_0+\mu e$, where $Vth_0$ is a current voltage threshold value, Vth is a new (updated) voltage threshold value, and μ is a weighting factor that controls the time constant of the comparator update algorithm. Accordingly, logic or circuitry is provided for calibrating or correcting for the offset based on the expected value "e" and a weighing factor μ controlling a time constant of the calibration or correction of the comparator offset. By controlling the suitable weighing factor μ, the calibration or correction algorithm can be tuned to react or respond to changing comparator offsets quickly or slowly. In some embodiments, the expected value "e" can be fed directly to update the comparator (i.e., μ=1), and the estimate e and the detectors can be reset every time the update happens. The comparator voltage threshold Vth can be fed back to the comparator to calibrate the comparator, or some other suitable parameter can be computed based on the expected value "e" to digitally correct for the comparator offset. The accumulators of task 708 and 710 can be reset, in preparation for the next cycle. The accumulators of task 708 and 710 can implement a first in first out mechanism so that the expected value "e" is computed based on a "moving average" instead of clearing the accumulated values completely.

Quick Compensation

Generally speaking, the algorithm responds slowly when calibration or correcting for the comparator offset. For this reason, the "slow-to-respond" algorithm described so far may not react quickly enough to catastrophic changes in the input. To address this issue, a separate quick compensation path 718 is provided in parallel with the slow algorithm. This separate quick compensation path 718 would be exercised if a large error is detected (e.g., if the residue consumes most of the correction range). For instance, a large error is detected if the correction range is completely consumed (90-95% is consumed). Logic or circuitry can be provided to detect one or more data samples cross a predetermined threshold (e.g., data sample(s) are greater than the threshold or smaller than the threshold), and logic or circuitry can be provided to apply a correction to the comparator in response to detecting one or more data samples crossing the predetermined threshold regardless of the expected value. The separate quick compensation path 718 quickly pushes the comparator offset to a desirable direction in a coarse way to reduce the correction range consumption.

In an example, a very fast attack technique (represented by the separate quick compensation path 718) can be employed where if the residue or the output crosses a certain threshold (e.g., 90-100% of the correction range), the algorithm responds immediately by applying a relatively large (but not too large) correction to the offset to bring the residue back to a more manageable range as soon as possible. The magnitude of that offset correction can be preset to, e.g., 25% of the correction range. This can be done without any averaging or pairing of inputs from neighboring subranges as explained previously in the slow-to-respond algorithm. This fast attack measure is viable because usually the BW mismatch contribution is small, meaning it would not lead the offset to be that large by itself. Therefore, the separate quick compensation path 718 can be used as a stop gap measure to prevent over-ranging and missing codes, until the slow-to-respond algorithm calculates the offset more accurately. This separate quick compensation path 718 measure prevents large delays in providing comparator offset correction when the signal suddenly appears after an extremely long disappearance. The complete algorithm, as illustrated by FIG. 7 (including the separate quick compensation path 718) ensures quick recovery when the signal re-appears (in a fraction of a microsecond).

The separate quick compensation path 718 is particularly desirable because it supplements the slow-to-respond algorithm which relies on accumulating many maximum and minimum values. When there are no data samples for a long time, unfortunately there is no data for the slow-to-respond algorithm to work, the estimation of the comparator offset would freeze. Unfortunately, during this time when there are no data samples, the comparators are still aging. As soon as data samples appears again, the comparator may have changed significantly without proper correction. Accordingly, the separate path 718 can provide a short term correction to the comparator offset until the slow-to-respond algorithm can estimate the comparator offset.

This process ensures accurate estimation of the comparator offset in the background. In addition, it may be desirable (as mentioned before) to have a separate quick compensation path 718, that bypasses this accumulation process, for fast correction of gross (catastrophic) errors as mentioned before. Data samples of the residue and/or the output of the overall ADC can be used for detecting the catastrophic error.

Dither and Shuffling

As previously mentioned, the background method observes data samples when an input signal is present in order to estimate the offset. If the input signal is absent for a long time, or is present but the input signal is not exercising some of the comparators, the offset estimation of the inactive comparators can freeze during that period. Any aging or change in offset may not be detected until the input signal appears again. To address this issue, the leaky peak and trough detectors allow the optimization of the "attack" time constant to be relatively fast and independent of the recovery time constant, such that the technique responds relatively quickly to the signal once it appears. Alternatively the "e" signal can be fed back to the comparator directly (i.e. μ=1), with resetting the estimate e and the detectors every time the update happens.

However, if that is not acceptable, continuous signal activity (and thus sufficient number of data samples for the comparators are made) can be easily ensured by a injecting a large dither signal in the flash, and/or shuffling the comparators randomly to ensure all of the "see" the injected signal. When shuffling is used, additional circuitry can keep track of which comparator was responsible for the data samples so that the measured offset based on the data samples can be used to correct the offset for the proper comparator. For instance, a dither signal can be injected at the input of the sub-ADC. Furthermore, comparators of the sub-ADC can be shuffled to ensure all comparators of the sub-ADC are used to convert the dither signal over time. Generally speaking, the dither help enable the calibration algorithms to be more independent from the presence or characteristics of the input signal. If the input signal is very small, only some of the comparators are used (thus the algorithm may not necessarily accumulate enough values for computing the expected value) when compared with a very large input signal. Dithering can help ensure more comparators are used (more evenly as well), even if the input signal is small.

System Description

Figure 8:
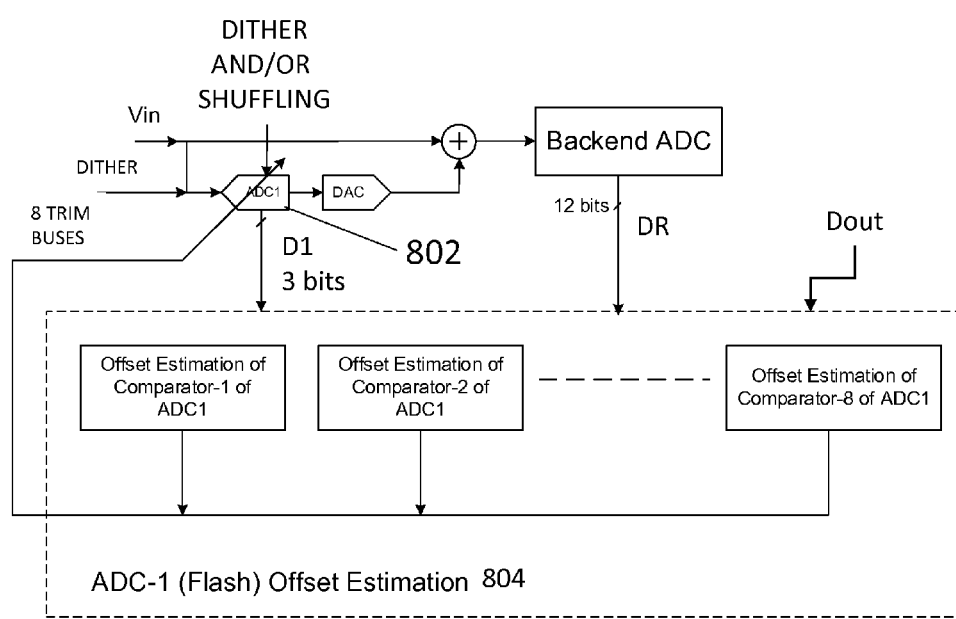
FIG. 8 shows a system diagram of a pipeline ADC with circuitry for estimating comparator offset of a sub-analog-to-digital converter (sub-ADC) of an analog to digital converter (ADC) while being insensitive to input distribution and/or bandwidth mismatch of the sub-ADC, according to some embodiments of the disclosure.

FIG. 8 shows a system diagram of a pipeline ADC with circuitry for estimating comparator offset of a sub-analog-to-digital converter (sub-ADC) of an analog to digital converter (ADC) while being insensitive to bandwidth mismatch of the sub-ADC and/or input distribution, according to some embodiments of the disclosure. In this example, there are eight comparators for the 3-bit flash ADC1 802 (sub-ADC of the front end or first stage of the pipeline ADC). Accordingly, the ADC-1 (Flash) offset estimation block 804 may include 8 comparator offset estimation blocks (shown as "Offset Estimation of Compartor-1 of ADC1", "Offset Estimation of Compartor-2 of ADC1" . . . "Offset Estimation of Compartor-8 of ADC1"). The ADC-1 (Flash) offset estimation block 804 can take data samples of the residue DR and/or data samples of the output of the overall ADC Dout as input for comparator offset estimation. It is possible that less comparator offset estimation blocks are provided in ADC-1 (Flash) Offset Estimation block 804, if a comparator offset estimation block is used for estimating the comparator offsets of multiple comparators one at a time (e.g., shared among multiple comparators, rotating over the multiple comparators). The comparator offset estimate can then be fed to ADC1 802 over the eight trim buses. Optional dither and/or shuffling are also shown if continuous comparator activity is desired. As for the comparator offset adjustment, any circuit offset correction technique can be used. This approach is agnostic to how the offset calibration or correction is done in the sub-ADC itself.

Advantages of the Background Method

The background method described herein accurately extracts the comparator offsets from the residue or the ADC output, while taking out the BW (and timing) mismatch contribution. Accurate estimation of the comparator offset can be done advantageously in the background during operation of the ADC using leaky peak and trough detectors.

By detecting peaks and troughs, the information about the neighboring subranges is insensitive to the input distribution. The attack time of the peak and trough detectors can be selected and/or adjusted to ensure relatively fast estimation, and the decay time can be selected and/or adjusted to provide recovery from noise errors (wrong estimates). In some cases, a separate quick compensation path is provided to quickly correct for gross/catastrophic errors. In some cases, the comparators can be kept "busy" in the absence of an input signal using dithering and/or shuffling. The comparator offset estimate can advantageously capture all sources of offsets or gain errors in the comparators including the latch, preamplifier, sampling network, reference errors, etc. Moreover, the background method does not require any analog circuits in the input or output paths of the comparators. Therefore, it does not degrade the propagation delay or sampling BW of the comparator.

Alternative Method for Measuring Comparator Offset: Averaging Residue

The present disclosure, describes a method for measuring comparator offset while averaging out the BW mismatch component and being insensitive to the distribution of the input signal. This means that even when the region of variable offset caused by BW mismatch is asymmetric about the "actual" comparator offset, the method can still average out the BW mismatch and extract the "actual" comparator offset. In some embodiments, the input signal has an "even" or "symmetric" distribution in terms of its rise and fall, and thus any contribution to the measurements caused by an asymmetric region of variable offset surrounding the "actual" comparator offset is minimal. In some embodiments, the system can assume the BW mismatch is small, or does not care if the measured offset has a BW mismatch component in it. In such embodiments, it is possible to provide an alternative method for measuring the comparator offset, which can still average out some or all of the BW mismatch but is sensitive to the distribution of the input signal.

Figure 9:
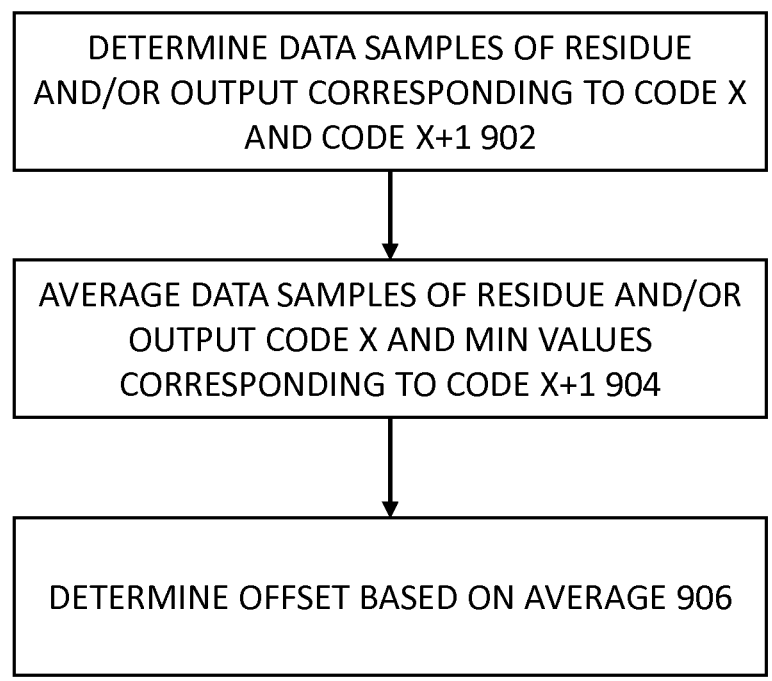
FIG. 9 shows a flow diagram illustrating a background method for estimating comparator offset of a sub-analog-to-digital converter (sub-ADC) of an analog to digital converter (ADC), according to some embodiments of the disclosure.

FIG. 9 shows a flow diagram illustrating a background method for estimating comparator offset of a sub-analog-to-digital converter (sub-ADC) of an analog to digital converter (ADC) which may be sensitive to the BW mismatch component, according to some embodiments of the disclosure. In task 902, a first logic or circuitry determines data samples of (1) a residue signal (VR) generated based on a difference between an input signal to the sub-ADC and a reconstructed version of the input signal or (2) an output signal of the ADC, wherein data samples corresponds to either a first code or a neighboring code, and the first code and the neighboring code are associated with a comparison made by a comparator of the sub-ADC. In some embodiments, the sub-ADC can be a flash ADC or quantizer of a first stage of a pipeline analog-to-digital converter. Generally, the comparator offset of the first stage has the greatest effect on the overall performance of the pipeline ADC. Data samples of the residual signal can be readily available as a digital signal DR generated by a sub-ADC of the subsequent stage (processing the residual signal VR). Data samples of the output of the overall ADC is also readily available as a digital signal Dout, which is the digital output of the overall ADC combining the digital output codes of each stage. Herein, passages use VR and DR interchangeably, and use Vout and Dout interchangeably.

Referring back to FIG. 3, the first logic/circuitry determines data samples of the residue signal (VR) corresponding to code 0001 (VR1|code=0001) and 0010 (VR1|code=0010) on the y-axis or data samples of the output signal of the ADC corresponding to code 0001 (Vout|code=0001) and 0010 (Vout|code=0001) on the x-axis. For a pipeline ADC, the residue VR being observed can be the residue of any one of the stages, e.g., the first stage or front end stage of the pipeline ADC. The overall ADC output being observed would be the digital output generated based on the digital output code generated by all the states of the pipeline ADC. The data samples serve as measurements that that can information from which the comparator offset can be estimated.

In task 904, a second logic or circuitry and non-transitory storage medium averages data samples of the residue and/or output code collected/accumulated over time. By averaging the data samples from the two neighboring subranges, it is possible to mathematically estimate the boundary between the two neighboring subranges or compute an expected value which is at or near the middle of the region of variable offset (see FIG. 3). Such averaging scheme would be sensitive to the input distribution, since the average of the data samples finds a midpoint in the region of variable offset, and the input distribution can sometimes mean the region of variable offset is asymmetric about the "actual" comparator offset. Thus, the midpoint may be (slightly) off from the "actual" comparator offset if an uneven input distribution and BW mismatch results in an asymmetric region of variable offset.

Nevertheless, the averaging scheme is effective at averaging at least some of the BW mismatch's contribution over time. This can be particularly beneficial if BW mismatch is expected to be small or negligible (or a symmetric input distribution is expected), in which case this averaging method can provide an effective solution for estimating the comparator offset.

In task 906, a third logic or circuitry can determine the offset based on the average (value) of the data samples. For instance, a difference between an ideal comparator threshold value and the average of the data samples can be used as an estimate of the comparator offset. The estimate of the comparator offset can then be used to adjust the comparator threshold (e.g., by trimming).

The averaging method illustrated by FIG. 9 can also include accumulating sufficient samples from both neighboring subranges before the average is determined based on data samples of the two neighboring subranges. When there are enough data samples, the average can be computed and thus the comparator offset can be estimated.

The averaging method illustrated by FIG. 9, which can be slow-to-react, can also be used in combination with a separate quick compensation path for quickly adjusting the comparator offset if the data sample(s) crosses (e.g., is above or below) a predetermined threshold (e.g., the separate quick compensation path 718 of FIG. 7).

Figure 10:
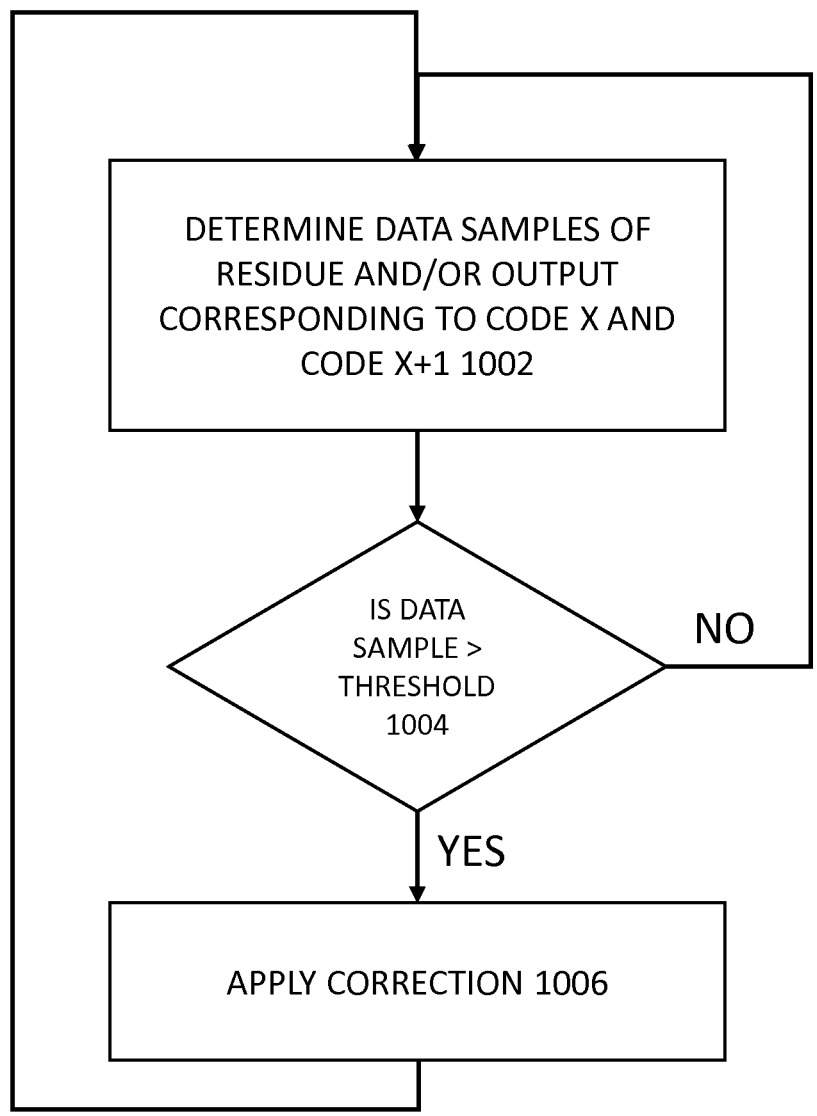
FIG. 10 shows a flow diagram illustrating a quick compensation method for correcting undershoots or overshoots in the residue of a stage in a pipeline analog-to-digital converter (ADC), according to some embodiments of the disclosure.

Quick Compensation Method for Correcting Undershoots or Overshoots in the Residue FIG. 10 shows a flow diagram illustrating a quick compensation method for correcting undershoots or overshoots in the residue of a stage in a pipeline analog-to-digital converter (ADC), according to some embodiments of the disclosure. Independent of a slow measurement and correction method for estimating the comparator threshold, the quick compensation method illustrated in FIG. 10 can be implemented to prevent the residue from exceeding the correction range. In task 1002, a first logic or circuitry determines data samples of (1) a residue signal (VR) generated based on a difference between an input signal to the sub-ADC and a reconstructed version of the input signal or (2) an output signal of the ADC, wherein data samples corresponds to either a first code or a neighboring code, and the first code and the neighboring code are associated with a comparison made by a comparator of the sub-ADC.

In check 1004, a second logic or circuitry can determine whether the data sample crosses a predetermined threshold (e.g., determine whether data sample(s) are greater than the threshold or smaller than the threshold). This check provides a way to determine whether most of the correction range has been consumed (e.g., 90% of the correction range).

In task 1006, third logic or circuitry can apply a correction to the comparator in response to detecting one or more data samples crossing the predetermined threshold regardless of the expected value of the peaks and troughs, and regardless of the average value of the data samples. Advantageously, the quick compensation method (e.g., corresponding to the separate quick compensation path 718 of FIG. 7) quickly pushes the comparator offset to a desirable direction in a coarse way to reduce the correction range consumption.

Variations and Implementations

Note that the background method can be used to estimate comparator offsets for the sub-ADCs of a pipeline ADC, which can be used in medical systems, scientific instrumentation, wireless and wired communications, radar, industrial process control, audio and video equipment, consumer electronics, aerospace or military systems, automotive systems, instrumentation, and other digital-processing-based systems where conversion of an analog input signal to a digital signal is needed.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various apparatuses for estimating comparator offset can include electronic circuitry or logic to perform the functions described herein. In some cases, one or more functions can be carried out by a (on-chip) processor or a digital processing circuitry specially configured for carrying out the functions (e.g., computing maximum and minimum values, computing expected values, etc.) described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, the ADC may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically with the ADC. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In various embodiments, the functionalities for calibration described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a (on-chip) processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to comparator offset calibration, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for estimating comparator offset of a sub-analog-to-digital converter (sub-ADC) of an analog to digital converter (ADC), the method comprising:
    determining data samples of (1) a residue signal generated based on a difference between an input signal to the sub-ADC and a reconstructed version of the input signal or (2) an input signal to the sub-ADC, wherein data samples corresponds to two neighboring codes which are associated with a comparison made by a comparator of the sub-ADC;
    tracking, over time, state information of the neighboring codes based on the data samples; and
    determining an expected value, which estimates an offset of the comparator, based on the state information.

2. The method of claim 1, further comprising:
    calibrating or correcting for the offset based on the expected value.

3. The method of claim 1, wherein the sub-ADC is a flash ADC or quantizer of any stage of a pipeline analog-to-digital converter.

4. The method of claim 1, wherein:
    the state information comprises (1) maximum values of the data samples corresponding to the first code and/or (2) minimum values of data samples corresponding to the neighboring code;
    tracking the maximum values of the data samples comprises generating a new maximum value based on a current maximum value and a first difference between a current data sample of the data samples and the current maximum value; and
    tracking the minimum values of the data samples comprises generating a new minimum value based on a current minimum value and a second difference between a current data sample of the data samples and the current minimum value.

5. The method of claim 4, wherein:
    the first difference is scaled by a first coefficient and is combined with the current maximum value; and
    the second difference is scaled by a second coefficient and is combined with the current maximum value.

6. The method of claim 5, wherein:
    value of the first coefficient depends on whether the first difference is positive or negative; and
    value of the second coefficient depends on whether the second difference is positive or negative.

7. The method of claim 1, wherein:
    the state information comprises (1) maximum values of the data samples corresponding to the first code and/or (2) minimum values of data samples corresponding to the neighboring code;
    the data samples are based on the residual signal; and
    determining the expected value comprises:
        accumulating, over time, values representing a midpoint between a current maximum value and a current minimum value; and
        determining the expected value based on the accumulated values.

8. The method of claim 1, wherein:
    the state information comprises (1) maximum values of the data samples corresponding to the first code and/or (2) minimum values of data samples corresponding to the neighboring code;
    the data samples are based on the input to the sub-ADC; and
    determining the expected value comprises:
        accumulating, over time, the maximum values and/or the minimum values; and
        determining the expected value based on the accumulated values.

9. The method of claim 1, further comprising:
    detecting one or more data samples cross a predetermined threshold; and
    applying a correction to the comparator in response to detecting the one or more data samples crossing the predetermined threshold regardless of the expected value.

10. The method of claim 1, further comprising:
    calibrating or correcting for the comparator offset based on the expected value and a weighing factor controlling a time constant of the calibration or correction of the comparator offset.

11. The method of claim 1, further comprising:
    injecting a dither signal to the sub-ADC; and/or
    shuffling comparators of the sub-ADC to ensure all comparators of the sub-ADC are used over time.

12. System for estimating comparator offset of a sub-analog-to-digital converter (sub-ADC) of an analog to digital converter (ADC), the system comprising:
    first logic to observe data samples pertaining to a comparator of the sub-ADC, wherein the data samples include digital representations of (1) a residue signal generated based on a difference between an input signal to the sub-ADC and a reconstructed version of the input signal or (2) input to the sub-ADC, and the data samples corresponds to either a first code or a neighboring code;

peak detector to compute maximum values of the data samples corresponding to the first code;

trough detector to compute minimum values of data samples corresponding to the neighboring code; and second logic to determine an expected value, which estimates an offset of the comparator, based on the maximum values and the minimum values.

13. The system of claim 12, wherein:

the peak detector generates a new maximum value based on a current maximum value and a first difference between a current data sample of the data samples and the current maximum value; and the trough detector generates a new minimum value based on a current minimum value and a second difference between a current data sample of the data samples and the current minimum value.

14. The system of claim 12, wherein the digital representations of the residue signal comprises output codes from logic in a subsequent sub-ADC digitizing the residue.

15. The system of claim 12, wherein digital representations of the input to the ADC comprises output codes from the sub-ADC.

16. The system of claim 12, wherein:

the data samples are based on the residual signal; and the second logic for determining the expected value based on the maximum values and minimum values comprises:

logic for accumulating, over time, values representing a midpoint between a current maximum value and a current minimum value; and logic for determining the expected value based on the accumulated values.

17. The system of claim 12, wherein:

the data samples are based on the input to the sub-ADC;

the second logic determining the expected value based on the maximum values and minimum values comprises:

logic for accumulating, over time, maximum values and minimum values; and logic for determining the expected value based on the accumulated values.

18. The system of claim 12, further comprising:

logic for detecting one or more of the data samples cross a predetermined threshold; and logic for applying a correction to the comparator in response to detecting the one or more data samples crossing the predetermined threshold regardless of the expected value.

19. The system of claim 12, further comprising:

logic for calibrating or correcting for the comparator offset based on the expected value and a weighing factor controlling a time constant of the calibration or correction of the comparator offset.

20. An apparatus for estimating comparator offset of a sub-analog-to-digital converter (sub-ADC) of an analog to digital converter (ADC), the apparatus comprising:

means for taking data samples associated with a comparator of the sub-ADC responsible for a first code and a neighboring code;

means for accumulating, over time, (1) maximum values of the data samples corresponding to a first code and (2) minimum values of data samples corresponding to a neighboring code; and means for determining an estimated offset of the comparator based on the maximum values and minimum values after enough number of maximum and minimum value have been accumulated.

* * * * *